(12) United States Patent
Lee et al.

(10) Patent No.: US 11,114,512 B2
(45) Date of Patent: *Sep. 7, 2021

(54) ORGANIC LIGHT EMITTING DIODE DISPLAY

(71) Applicant: LG Display Co., Ltd., Seoul (KR)

(72) Inventors: Jaesung Lee, Paju-si (KR); Dohyung Kim, Paju-si (KR); Seungwon Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/195,519

(22) Filed: Nov. 19, 2018

(65) Prior Publication Data

US 2019/0165063 A1 May 30, 2019

(30) Foreign Application Priority Data

Nov. 30, 2017 (KR) ........................ 10-2017-0163094

(51) Int. Cl.
*H01L 27/32* (2006.01)
*H01L 51/52* (2006.01)

(52) U.S. Cl.
CPC ........ *H01L 27/3246* (2013.01); *H01L 27/322* (2013.01); *H01L 27/3276* (2013.01); *H01L 51/5225* (2013.01); *H01L 51/5228* (2013.01); *H01L 51/5253* (2013.01)

(58) Field of Classification Search
None
See application file for complete search history.

(56) References Cited

U.S. PATENT DOCUMENTS

| | | | |
|---|---|---|---|
| 8,022,621 B2* | 9/2011 | Park | H01L 27/3253 |
| | | | 313/506 |
| 10,686,022 B2* | 6/2020 | Lee | H01L 27/3246 |
| 2009/0174318 A1* | 7/2009 | Kim | H01L 51/5259 |
| | | | 313/504 |
| 2012/0223342 A1* | 9/2012 | Tanada | H01L 51/5228 |
| | | | 257/88 |
| 2013/0056784 A1* | 3/2013 | Lee | H01L 27/3279 |
| | | | 257/99 |
| 2014/0183479 A1* | 7/2014 | Park | H01L 51/56 |
| | | | 257/40 |

(Continued)

FOREIGN PATENT DOCUMENTS

KR 10-2008-0003061 A 1/2008
KR 10-2008-0078959 A 8/2008

*Primary Examiner* — Abul Kalam
(74) *Attorney, Agent, or Firm* — Fenwick & West LLP

(57) ABSTRACT

An organic light emitting diode display is disclosed. The organic light emitting diode display includes a first substrate and a second substrate facing each other. The first substrate includes an anode included in an organic light emitting diode, an auxiliary electrode, a barrier on the auxiliary electrode, a bank layer including a first opening exposing at least a portion of the anode and a second opening simultaneously exposing at least a portion of the auxiliary electrode and at least a portion of the barrier, a cathode included in the organic light emitting diode and divided by the barrier, a contact electrode disposed on the cathode and divided by the barrier, and a protective layer interposed between the cathode and the contact electrode. The contact electrode and the power line directly contact each other.

12 Claims, 10 Drawing Sheets

(56) References Cited

U.S. PATENT DOCUMENTS

| | | | |
|---|---|---|---|
| 2014/0183501 A1* | 7/2014 | Kim | H01L 27/3246 |
| | | | 257/40 |
| 2016/0071914 A1* | 3/2016 | Lee | H01L 27/3246 |
| | | | 257/40 |
| 2017/0047386 A1* | 2/2017 | Lee | H01L 27/3246 |
| 2019/0140039 A1* | 5/2019 | Lee | H01L 27/3297 |
| 2019/0165064 A1* | 5/2019 | Lee | H01L 27/3253 |
| 2019/0198805 A1* | 6/2019 | Kim | H01L 51/5228 |
| 2019/0198806 A1* | 6/2019 | Im | H01L 51/5284 |
| 2019/0207150 A1* | 7/2019 | Kwon | H01L 51/5228 |
| 2019/0207168 A1* | 7/2019 | Lee | H01L 27/3272 |

* cited by examiner

ORGANIC LIGHT EMITTING DIODE DISPLAY

CROSS-REFERENCE TO RELATED APPLICATION

This application claims priority to Republic of Korea Patent Application No. 10-2017-0163094 filed on Nov. 30, 2017 with the Korean Intellectual Property office, which is incorporated herein by reference in its entirety.

BACKGROUND

Field of Technology

The present disclosure relates to an organic light emitting diode display.

Discussion of the Related Art

Various display devices have replaced heavier and larger cathode ray tubes (CRTs). Examples of the display devices may include a liquid crystal display (LCD), a field emission display (FED), a plasma display panel (PDP), and an organic light emitting diode (OLED) display.

In more detail, an OLED display is a self-emission display configured to emit light by exciting an organic compound. The OLED display does not require a backlight unit used in a liquid crystal display and thus has advantages of a thin profile, lightness in weight, and a simpler manufacturing process. The OLED display can be also manufactured at a low temperature and has a fast response time of 1 ms or less, low power consumption, a wide viewing angle, and a high contrast. Thus, the OLED display has been widely used.

The OLED display includes organic light emitting diodes (OLEDs) converting electric energy into light energy. The OLED includes an anode, a cathode, and an organic compound layer between the anode and the cathode. The OLED display is configured such that the OLED emits light while excitons formed by combining holes from the anode and electrons from the cathode inside an emission layer fall from an excited state to a ground state, and thus displays an image.

However, a large-area OLED display cannot maintain a uniform luminance throughout an entire surface of an active area, on which an input image is displayed, and generates a luminance variation (or luminance deviation) depending on a position. More specifically, a cathode constituting an organic light emitting diode is formed to cover most of the active area, and there is a problem that a power voltage applied to the cathode does not have a constant voltage value throughout the entire surface of the active area. For example, as a difference between a voltage value at an entrance of the cathode supplied with the power voltage and a voltage value at a position apart from the entrance increases due to a resistance of the cathode, the luminance variation depending on the position increases.

The problem is more problematic in a top emission type display device. Namely, in the top emission type display device, because it is necessary to secure a transmittance of a cathode positioned at an upper layer of an organic light emitting diode, the cathode is formed of a transparent conductive material such as indium tin oxide (ITO), or an opaque conductive material with a very small thickness. In this instance, because a surface resistance of the cathode increases, a luminance variation depending on a position remarkably increases corresponding to an increase in the surface resistance.

In order to solve such a problem, a method was proposed to prevent a voltage drop depending on a position by forming a low potential power voltage line including a low resistance material and connecting the low potential power voltage line to a cathode. In the proposed method according to a related art, because the low potential power voltage line was formed on a lower substrate including transistors, one pixel has to further include a formation area of the low potential power voltage line and a connection area of the low potential power voltage line and the cathode in addition to a thin film transistor area and a storage capacitor area. Thus, it was difficult to apply the related art to a high-resolution display including small-sized unit pixels.

SUMMARY

The present disclosure provides an organic light emitting diode display capable of achieving a uniform luminance by minimizing a variation in a low potential power voltage depending on a position.

In one aspect, there is provided an organic light emitting diode display comprising a first substrate on which an organic light emitting diode is disposed, and a second substrate on which a power line supplied with a power voltage is disposed, the second substrate facing the first substrate, wherein the first substrate includes an anode included in the organic light emitting diode, an auxiliary electrode, a barrier on the auxiliary electrode, a bank layer including a first opening exposing at least a portion of the anode and a second opening simultaneously exposing at least a portion of the auxiliary electrode and at least a portion of the barrier, a cathode included in the organic light emitting diode and divided by the barrier, one end of the cathode divided by the barrier directly contacting the auxiliary electrode, a contact electrode disposed on the cathode and divided by the barrier, one end of the contact electrode divided by the barrier directly contacting the auxiliary electrode or the cathode, and a protective layer interposed between the cathode and the contact electrode, wherein the contact electrode and the power line directly contact each other.

The bank layer is divided into a first portion defining the first opening and a second portion defining the second opening. A height of the first portion is less than a height of the second portion.

The bank layer is divided into a first portion defining the first opening and a second portion overlapping at least a portion of the barrier. A height of the first portion is less than a height of the second portion.

The protective layer on the cathode exposes at least a portion of one end of the cathode. The contact electrode directly contacts the exposed portion of the cathode.

The cathode and the contact electrode are physically spaced from each other with the protective layer interposed therebetween.

The second substrate includes color filters, and the color filters are partitioned by the power line.

Each of the first substrate and the second substrate includes an emission region, to which light from the organic light emitting diode is emitted, and a non-emission region outside the emission region. The power line is disposed in the non-emission region.

The organic light emitting diode display further comprises a filler layer interposed between the first substrate and the second substrate.

The barrier is divided into a plurality of parts on the auxiliary electrode.

The cathode, the protective layer and the contact electrode maintain their continuity in a portion overlapping the bank layer among a formation area of the barrier.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Reference will now be made in detail to embodiments of the disclosure, examples of which are illustrated in the accompanying drawings. Wherever possible, the same reference numbers will be used throughout the drawings to refer to the same or like parts. Detailed descriptions of known arts will be omitted if such may mislead the embodiments of the disclosure. In describing various embodiments, the same components may be described in a first embodiment, and a description thereof may be omitted in other embodiments.

The terms "first", "second", etc. may be used to describe various components, but the components are not limited by such terms. The terms are used only for the purpose of distinguishing one component from other components.

Figure 1:
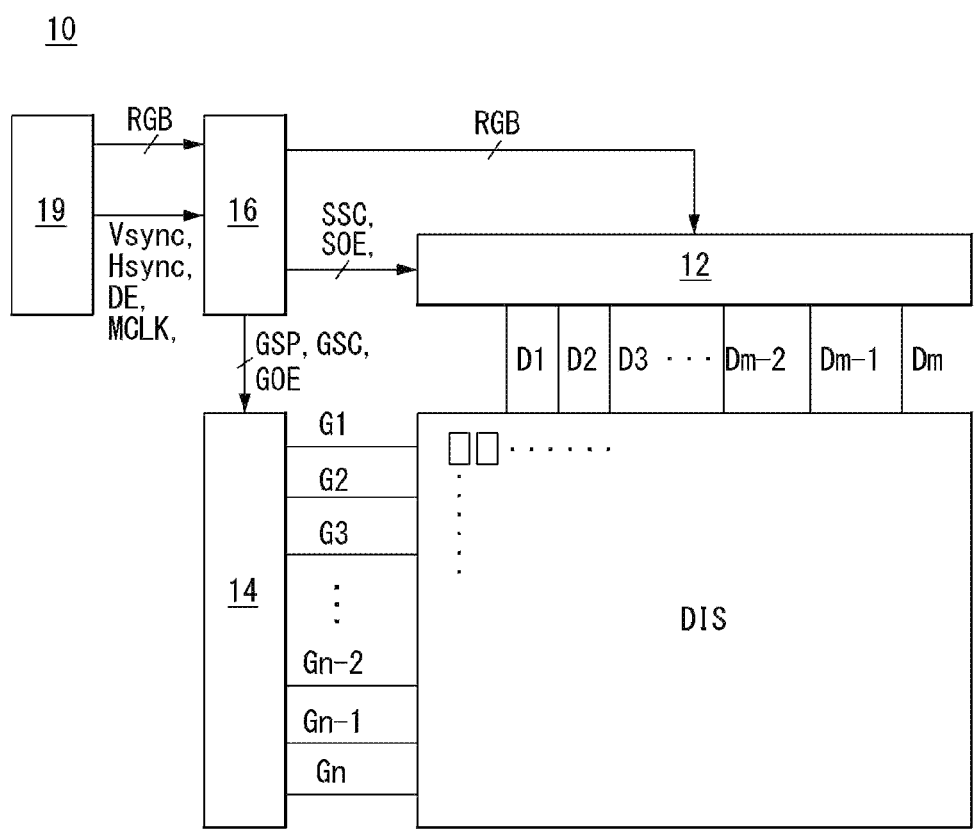
FIG. 1 is a block diagram schematically illustrating an organic light emitting diode (OLED) display according to an embodiment of the disclosure.
Figure 2:
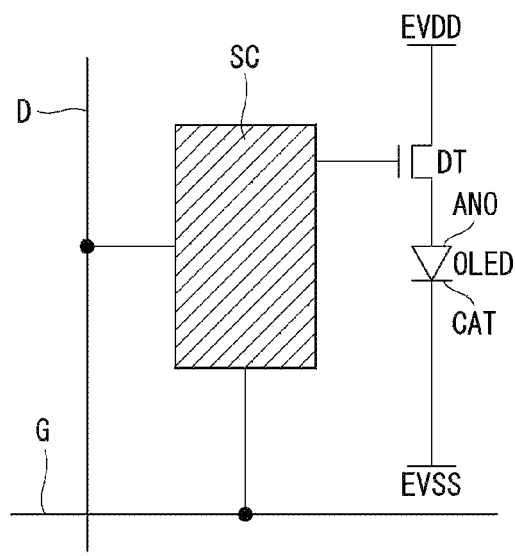
FIG. 2 schematically illustrates configuration of a pixel shown in FIG. 1 according to an embodiment of the disclosure.

FIG. 1 is a block diagram schematically illustrating an organic light emitting diode (OLED) display according to an embodiment of the disclosure. FIG. 2 schematically illustrates configuration of a pixel shown in FIG. 1.

Referring to FIG. 1, an OLED display 10 according to an embodiment of the disclosure includes a display driving circuit and a display panel DIS.

The display driving circuit includes a data driving circuit 12, a gate driving circuit 14, and a timing controller 16. The display driving circuit applies a video data voltage of an input image to pixels of the display panel DIS. The data driving circuit 12 converts digital video data RGB received from the timing controller 16 into an analog gamma compensation voltage and generates a data voltage. The data voltage output from the data driving circuit 12 is supplied to data lines D1 to Dm, where m is a positive integer. The gate driving circuit 14 sequentially supplies a gate signal synchronized with the data voltage to gate lines G1 to Gn and selects pixels of the display panel DIS to which the data voltage is applied, where n is a positive integer.

The timing controller 16 receives timing signals, such as a vertical sync signal Vsync, a horizontal sync signal Hsync, a data enable signal DE, and a main clock MCLK, from a host system 19 and synchronizes operation timing of the data driving circuit 12 with operation timing of the gate driving circuit 14. A data timing control signal for controlling the data driving circuit 12 includes a source sampling clock SSC, a source output enable signal SOE, and the like. A gate timing control signal for controlling the gate driving circuit 14 includes a gate start pulse GSP, a gate shift clock GSC, a gate output enable signal GOE, and the like.

The host system 19 may be one of a television system, a set-top box, a navigation system, a DVD player, a Blu-ray player, a personal computer (PC), a home theater system, a phone system, and other systems that include or operate in conjunction with a display. The host system 19 includes a system-on chip (SoC), in which a scaler is embedded, and converts the digital video data RGB of the input image into a format suitable for displaying the input image on the display panel DIS. The host system 19 transmits the digital video data RGB of the input image and the timing signals Vsync, Hsync, DE and MCLK to the timing controller 16.

The display panel DIS includes a pixel array. The pixel array includes the pixels defined by the data lines D1 to Dm and the gate lines G1 to Gn. Each pixel includes an organic light emitting diode serving as a self-emission element.

Referring to FIG. 2, the display panel DIS includes a plurality of data lines D, a plurality of gate lines G intersecting the data lines D, and pixels respectively arranged at intersections of the data lines D and the gate lines G in a matrix. Each pixel includes an organic light emitting diode, a driving thin film transistor (TFT) DT for controlling an amount of current flowing through the organic light emitting diode, and a programming unit SC for setting a gate-to-source voltage of the driving thin film transistor DT.

The programming unit SC may include at least one switching thin film transistor and at least one storage capacitor. The switching thin film transistor is turned on in response to a gate signal from the gate line G to thereby apply a data voltage from the data line D to one electrode of the storage capacitor. The driving thin film transistor DT controls an amount of current supplied to the organic light emitting diode depending on a magnitude of voltage stored in the storage capacitor, thereby controlling an amount of light emitted by the organic light emitting diode. The amount of light emitted by the organic light emitting diode is proportional to the amount of current supplied from the driving thin film transistor DT. The pixel is connected to a high potential power voltage source and a low potential power voltage source and receives a high potential power voltage EVDD and a low potential power voltage EVSS from a power generator (not shown). The thin film transistors constituting the pixel may be p-type thin film transistors or n-type thin film transistors. Further, semiconductor layers of the thin film transistors constituting the pixel may include amorphous silicon, polycrystalline silicon, or oxide. In the following description, embodiments of the disclosure use a semiconductor layer including oxide as an example. The organic light emitting diode includes an anode ANO, a cathode CAT, and an organic compound layer between the anode ANO and the cathode CAT. The anode ANO is connected to the driving thin film transistor DT.

First Embodiment

Figure 3:
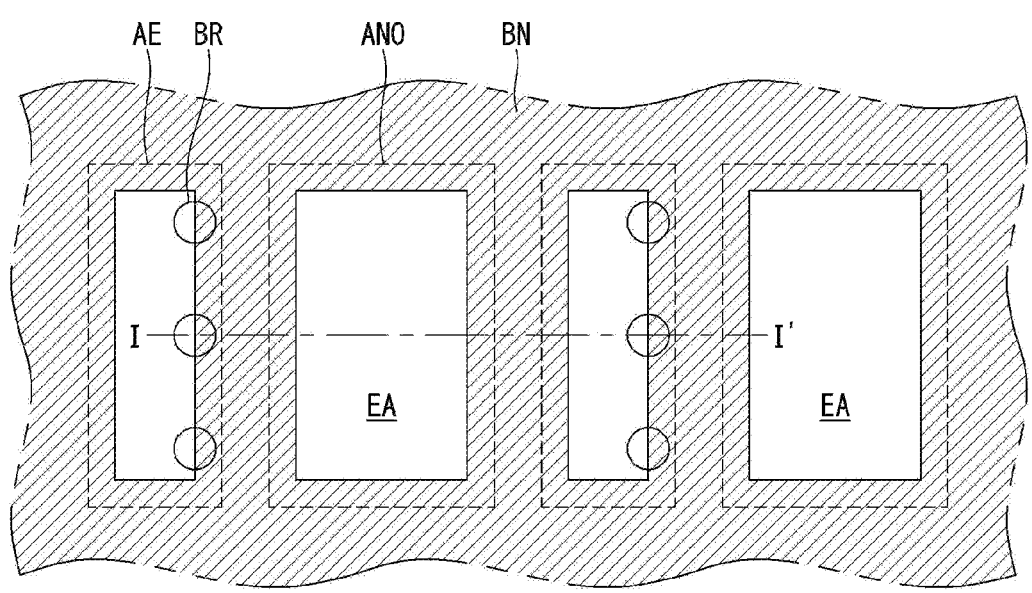
FIG. 3 is a plan view schematically illustrating an OLED display according to a first embodiment of the disclosure.
Figure 4:
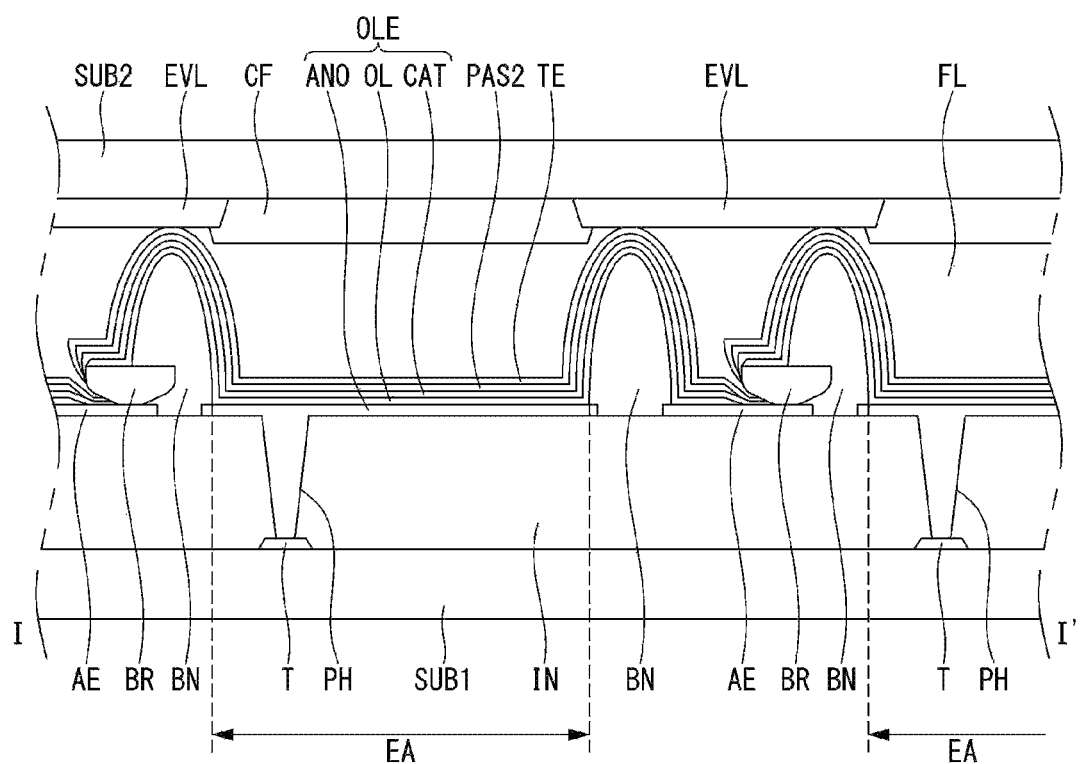
FIG. 4 is a cross-sectional view schematically illustrating an OLED display according to the first embodiment of the disclosure.

FIG. 3 is a plan view schematically illustrating an OLED display according to a first embodiment of the disclosure. FIG. 4 is a cross-sectional view schematically illustrating an OLED display according to the first embodiment of the disclosure. FIG. 5 illustrates a position relationship and a connection relationship of a cathode, a protective layer, and a contact electrode.

Referring to FIGS. 3 and 4, an OLED display according to a first embodiment of the disclosure includes a display panel including a first substrate SUB1 and a second substrate SUB2 facing each other. A filler layer FL may be interposed between the first substrate SUB1 and the second substrate SUB2.

The first substrate SUB1 is a thin film transistor array substrate on which a thin film transistor T and an organic light emitting diode OLE are disposed. The second substrate SUB2 is a substrate on which a low potential power voltage line (hereinafter referred to as "Evss line") EVL is disposed. The second substrate SUB2 may function as an encapsulation substrate. The first substrate SUB1 and the second substrate SUB2 may be attached to each other using a sealant (not shown). The sealant is disposed at an edge of the first substrate SUB1 and an edge of the second substrate SUB2 and maintains a predetermined distance between the first substrate SUB1 and the second substrate SUB2. The filler layer FL may be disposed inside the sealant.

The first substrate SUB1 may be made of glass material or plastic material. For example, the first substrate SUB1 may be made of plastic material such as polyimide (PI), polyethylene terephthalate (PET), polyethylene naphthalate (PEN), and polycarbonate (PC) and may have flexible characteristics.

The thin film transistor T and the organic light emitting diode OLE connected to the thin film transistor T are formed on the first substrate SUB1. A light shielding layer (not shown) and a buffer layer (not shown) may be formed between the first substrate SUB1 and the thin film transistor T. The light shielding layer is disposed to overlap a semiconductor layer, particularly, a channel of the thin film transistor T and can protect an oxide semiconductor element from external light. The buffer layer can block ions or impurities diffused from the first substrate SUB1 and also block moisture penetration from the outside.

The thin film transistor T may be implemented by various structures including a bottom gate structure, a top gate structure, a double gate structure, etc. Namely, the thin film transistor T may include a semiconductor layer, a gate electrode, and source and drain electrodes. The semiconductor layer, the gate electrode, and the source and drain electrodes may be disposed at different layers at least one insulating layer interposed therebetween.

At least one insulating layer IN may be interposed between the thin film transistor T and the organic light emitting diode OLE. The insulating layer IN may include a planarization layer formed of an organic material such as photo acryl, polyimide, benzocyclobutene-based resin, and acrylate-based resin. The planarization layer may planarize the surface of the first substrate SUB1, on which the thin film transistor T and various signal lines are formed. Although not shown, the insulating layer IN may further include a passivation layer formed of silicon oxide (SiOx), silicon nitride (SiNx), or a multilayer thereof. The passivation layer may be interposed between the planarization layer and the thin film transistor T. The thin film transistor T and the organic light emitting diode OLE may be electrically connected through a pixel contact hole PH penetrating one or more insulating layers IN.

The organic light emitting diode OLE and an auxiliary electrode AE are positioned on the insulating layer IN. The organic light emitting diode OLE includes an anode ANO, a cathode CAT facing the anode ANO, and an organic compound layer OL between the anode ANO and the cathode CAT.

The anode ANO may be formed of a single layer or a multilayer. The anode ANO may include a reflective layer and thus serve as a reflective electrode. The reflective layer may be formed of aluminum (Al), copper (Cu), silver (Ag), palladium (Pd), nickel (Ni), molybdenum (Mo), titanium (Ti), or a combination thereof. For example, the reflective layer may be formed of Ag/Pd/Cu (APC) alloy. For example, the anode ANO may be formed as a triple layer including ITO/Ag/ITO. The anode ANO may be divided corresponding to each pixel, and thus one anode ANO may be assigned to each pixel. The anode ANO is connected to the thin film transistor T through a pixel contact hole PH penetrating the insulating layer IN.

The auxiliary electrode AE may be formed of the same material as the anode ANO at the same layer as the anode ANO. In this instance, because a separate process for forming the auxiliary electrode AE does not need to be performed, the number of processes can be reduced. Hence, the manufacturing time and the manufacturing cost can be reduced, and product yield can be remarkably improved.

A barrier BR is positioned on the first substrate SUB1 on which the auxiliary electrode AE is formed. The barrier BR is positioned on the auxiliary electrode AE. The barrier BR functions to physically divide each of the organic compound layer OL, the cathode CAT, a protective layer PAS2, and a contact electrode TE that will be formed later. In other words, each of the organic compound layer OL, the cathode CAT, the protective layer PAS2, and the contact electrode TE is disposed on the auxiliary electrode AE and is physically divided by the barrier BR. Hence, each of the organic compound layer OL, the cathode CAT, the protective layer PAS2, and the contact electrode TE may be discontinuously formed in at least one area. To this end, an edge of the barrier BR may have an eaves shape. FIG. 4 illustrates that the barrier BR is formed of a single layer, by way of example. However, embodiments are not limited thereto. The barrier BR may have any shape, for example, a plurality of layers including a double layer, etc., as long as it can divide the above-described layers in at least one area.

FIG. 4 illustrates that the barrier BR is divided into a plurality of parts on the auxiliary electrode AE, by way of example. As another example, the barrier BR may be integrally formed on the auxiliary electrode AE. However, embodiments are not limited thereto. For example, one barrier BR may be provided on the auxiliary electrode AE. Further, FIG. 4 illustrates that a planar shape of the barrier BR is a roughly circular shape, by way of example. However, embodiments are not limited thereto. For example, the barrier BR may have various planar shapes including a square, a rectangle, an oval, etc.

A bank layer BN is positioned on the first substrate SUB1, on which the barrier BR is formed. Pixels may be partitioned by the bank layer BN. The bank layer BN may be formed of an organic material such as polyimide, benzocyclobutene-based resin, and acrylate.

The bank layer BN includes an opening. The opening includes a first opening exposing at least a portion of the anode ANO and a second opening simultaneously exposing at least a portion of the auxiliary electrode AE and at least a portion of the barrier BR. A portion of the anode ANO exposed by the first opening of the bank layer BN may be defined as an emission region EA. The exposed portion of the anode ANO may be designed to have as large an area as possible, in order to sufficiently secure an aperture ratio. For example, the bank layer BN may be configured to expose a center portion of the anode ANO and cover an edge of the anode ANO. Further, the bank layer BN may be configured to expose a center portion of the auxiliary electrode AE and cover an edge of the auxiliary electrode AE and a portion of the barrier BR.

The organic compound layer OL is positioned on the first substrate SUB1 on which the bank layer BN is formed. The organic compound layer OL may be widely formed on a front surface of the first substrate SUB1. The organic compound layer OL is a layer, in which electrons and holes combine and emit light. The organic compound layer OL includes an emission layer EML and may further include one or more of a hole injection layer HIL, a hole transport layer HTL, an electron transport layer ETL, and an electron injection layer EIL. The emission layer EML may include a light emitting material that generates white light.

The organic compound layer OL emitting white light may have a multi-stack structure, for example, an n-stack structure, where n is an integer equal to or greater than 1. For example, 2-stack structure may include a charge generation layer CGL between the anode ANO and the cathode CAT and a first stack and a second stack respectively disposed on and under the charge generation layer CGL. Each of the first stack and the second stack includes an emission layer and may further include at least one common layer. The emission layer of the first stack and the emission layer of the second stack may include light emitting materials of different colors, respectively.

The organic compound layer OL is physically divided by the barrier BR in at least one area. The organic compound layer OL is divided by the barrier BR and exposes at least a portion of the auxiliary electrode AE around the barrier BR. In a portion overlapping the bank layer BN among a formation area of the barrier BR, the organic compound layer OL is not divided by the bank layer BN and is continuously formed (i.e., maintains its continuity).

The cathode CAT is positioned on the organic compound layer OL. The cathode CAT may be widely formed on the front surface of the first substrate SUB1. The cathode CAT may be formed of a transparent conductive material such as indium tin oxide (ITO) and indium zinc oxide (IZO). Alternatively, the cathode CAT may be formed of a material, which is thin enough to transmit light, for example, magnesium (Mg), calcium (Ca), aluminum (Al), silver (Ag), or a combination thereof.

The cathode CAT is physically divided by the barrier BR in at least one area. The cathode CAT is divided by the barrier BR and exposes at least a portion of the auxiliary electrode AE around the barrier BR. In a portion overlapping the bank layer BN among a formation area of the barrier BR, the cathode CAT is not divided by the bank layer BN and is continuously formed (i.e., maintains its continuity).

The cathode CAT covers the organic compound layer OL, and one end of the cathode CAT directly contacts the auxiliary electrode AE. Namely, one end of the cathode CAT, which is divided by the barrier BR and is exposed, directly contacts an exposed upper surface of the auxiliary electrode AE. Such a structure may be implemented by a step coverage difference between materials forming the organic compound layer OL and the cathode CAT. For example, because the cathode CAT is made of a transparent conductive material having better step coverage than a formation material of the organic compound layer OL, the cathode CAT may be configured to directly contact the auxiliary electrode AE. Furthermore, in order to implement the structure, the organic compound layer OL and the cathode CAT may be formed using different methods. For example, the organic compound layer OL may be formed using a thermal deposition method, and the cathode CAT may be formed using a sputtering method. Hence, one end of the divided cathode CAT may be extended further than one end of the divided organic compound layer OL and may directly contact the auxiliary electrode AE.

The protective layer PAS2 is positioned on the cathode CAT. The protective layer PAS2 may be widely formed on the front surface of the first substrate SUB1. The protective layer PAS2 may be formed of a material such as silicon oxide (SiOx), silicon nitride (SiNx), and silicon oxynitride (SiON).

The protective layer PAS2 is positioned on the cathode CAT and can block the penetration of foreign material that may enter the organic light emitting diode OLE. For example, because the cathode CAT including a transparent conductive material is a crystalline component and cannot efficiently block the penetration of ions and moisture, external impurities may pass through the cathode CAT and may enter the organic compound layer OL. The embodiment of the disclosure further includes the protective layer PAS2 on the organic light emitting diode OLE and can block the penetration of foreign material that may enter the organic light emitting diode OLE. Hence, the embodiment of the disclosure can prevent a reduction in lifespan of the organic light emitting diode OLE and a luminance reduction.

In addition, the protective layer PAS2 is positioned on the cathode CAT and can buffer or mitigate a stress applied to the cathode CAT when the first substrate SUB1 and the second substrate SUB2 are attached to each other. For example, because the cathode CAT including the transparent conductive material has brittle characteristics, the cathode CAT may easily crack due to an external force applied. The embodiment of the disclosure further includes the protective layer PAS2 on the cathode CAT and can prevent a crack from being generated in the cathode CAT. Furthermore, the embodiment of the disclosure can prevent the penetration of oxygen or moisture through the crack.

The protective layer PAS2 is physically divided by the barrier BR in at least one area. The protective layer PAS2 is divided by the barrier BR and exposes at least a portion of the auxiliary electrode AE around the barrier BR. In a portion overlapping the bank layer BN among a formation area of the barrier BR, the protective layer PAS2 is not divided by the bank layer BN and is continuously formed (i.e., maintains its continuity).

The contact electrode TE is positioned on the protective layer PAS2. The contact electrode TE may be widely formed on the front surface of the first substrate SUB1. The contact electrode TE may be formed of a transparent conductive material such as indium tin oxide (ITO) and indium zinc oxide (IZO). Alternatively, the contact electrode TE may be formed of a material which is thin enough to transmit light, for example, magnesium (Mg), calcium (Ca), aluminum (Al), silver (Ag), or a combination thereof.

The contact electrode TE is physically divided by the barrier BR in at least one area. The contact electrode TE is divided by the barrier BR and exposes at least a portion of the auxiliary electrode AE around the barrier BR. In a portion overlapping the bank layer BN among a formation area of the barrier BR, the contact electrode TE is not divided by the bank layer BN and is continuously formed (i.e., maintains its continuity).

The contact electrode TE covers the protective layer PAS2, and one end of the contact electrode TE, that is divided by the barrier BR and is exposed, is electrically connected to the auxiliary electrode AE. Hence, the cathode CAT, the auxiliary electrode AE, and the contact electrode TE are electrically connected.

Figure 5A:
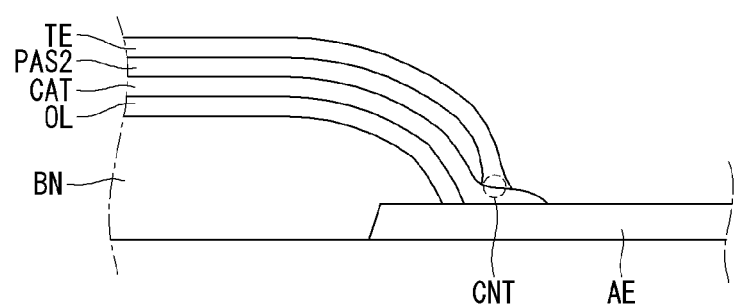
FIGS. 5A-C illustrate a position relationship and a connection relationship of a cathode, a protective layer, and a contact electrode according to one or more embodiments of the disclosure.

For example, referring to FIG. 5A, the protective layer PAS2 may be formed on the cathode CAT to expose at least one end of the cathode CAT. The contact electrode TE may directly contact the exposed end of the cathode CAT in at least one region CNT. Hence, the contact electrode TE can be electrically connected to the auxiliary electrode AE through the cathode CAT.

Figure 5B:
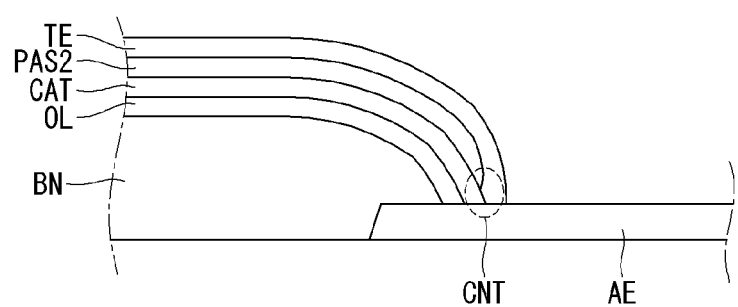

As another example, referring to FIG. 5B, the contact electrode TE more protrudes toward the barrier BR than the protective layer PAS2 and directly contacts the auxiliary electrode AE. In this instance, one end of the contact electrode TE and one end of the cathode CAT may directly contact each other. Namely, the protective layer PAS2 may be formed on the cathode CAT to expose at least one end of the cathode CAT. Here, the contact electrode TE may directly contact the exposed end of the cathode CAT in at least one region CNT. Hence, the contact electrode TE can directly contact each of the auxiliary electrode AE and the cathode CAT.

Figure 5C:
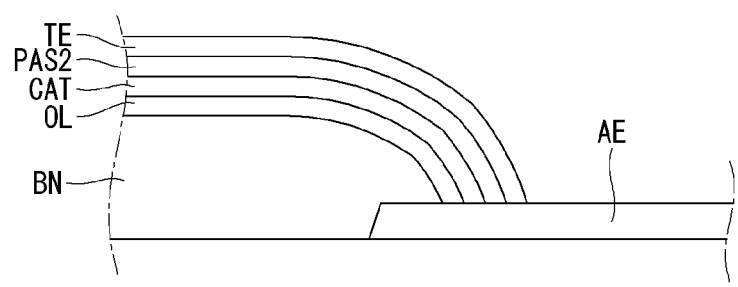

As another example, referring to FIG. 5C, the protective layer PAS2 may be configured to completely cover the cathode CAT. Namely, the protective layer PAS2 may be configured so that one end directly contacts the auxiliary electrode AE, and may completely cover the cathode CAT. The embodiment of the disclosure can efficiently block the penetration of foreign material that may enter the organic light emitting diode OLE by forming the protective layer PAS2 to completely cover the cathode CAT. In this instance, the cathode CAT and the contact electrode TE are physically spaced from each other with the protective layer PAS2 interposed therebetween.

The structures illustrated in FIGS. 5A-C may be implemented by properly controlling process conditions. For example, the cathode CAT and the contact electrode TE may be formed using a mask including openings having the same material and the same area, and in this instance, the structures illustrated in FIGS. 5A-C may be selectively implemented by selectively adjusting process parameters such as power and pressure.

The Evss line EVL may be further formed on the second substrate SUB2 attached to the first substrate SUB1. A color filter CF is formed on the second substrate SUB2. A stacking order of the Evss line EVL and the color filter CF on the second substrate SUB2 may be changed. For example, the color filter CF may be formed after the Evss line EVL is formed, or the Evss line EVL may be formed after the color filter CF is formed. However, as will be described later, in any case, the Evss line EVL is exposed and directly contacts the contact electrode TE. If necessary or desired, the color filter CF may be formed on the first substrate SUB1.

The Evss line EVL includes a low resistance conductive material. For example, the Evss line EVL may be formed of molybdenum (Mo), aluminum (Al), chromium (Cr), gold (Au), titanium (Ti), nickel (Ni), neodymium (Nd), copper (Cu), or a combination thereof.

The Evss line EVL may include a low reflective conductive material. For example, the Evss line EVL is formed of the low reflective conductive material and thus can prevent visibility from being reduced by the reflection of external light. Thus, a display device according to embodiments of the disclosure does not need to include a separate component for shielding (or absorbing) light incident from outside, like a polarizing film.

The Evss line EVL may function as a black matrix. Therefore, the Evss line EVL can prevent a defect of color mixture from occurring between neighboring pixels. The Evss line EVL is disposed corresponding to a non-emission region so as to expose at least the emission region EA. Further, the embodiment of the disclosure can use the Evss line EVL as the black matrix and thus does not need to additionally perform a separate process for forming the black matrix. Therefore, the embodiment of the disclosure can further reduce the number of processes compared to a related art structure, and thus can reduce the manufacturing time and the manufacturing cost and remarkably improve product yield.

The color filter CF may include red (R), blue (B), and green (G) color filters. The pixel may include subpixels emitting red, blue, and green light, and the color filters CF may be respectively assigned to the corresponding subpixels. The red, blue, and green color filters CF may be partitioned by the Evss line EVL.

The OLED display according to the embodiment of the invention can represent red, green, and blue colors by allowing white light emitted from the organic compound layer OL to pass through the red, green, and blue color filters CF respectively included in regions corresponding to red, green, and blue pixels PXL. If necessary or desired, the pixel may further include a white (W) subpixel.

The completed first and second substrates SUB1 and SUB2 are attached to each other. The filler layer FL may be interposed between the first substrate SUB1 and the second substrate SUB2. As the contact electrode TE on the first substrate SUB1 and the Evss line EVL on the second substrate SUB2 directly contact each other upon the attachment, the cathode CAT, the auxiliary electrode AE, the contact electrode TE, and the Evss line EVL of a low resistance are electrically connected. Hence, the cathode CAT, the auxiliary electrode AE, the contact electrode TE, and the Evss line EVL of the low resistance can form a power supply path through which a low potential power voltage is applied.

The first embodiment of the disclosure can reduce a voltage variation (or voltage deviation) depending on a position by connecting the Evss line EVL formed of the low resistance conductive material to the cathode CAT, thereby minimizing non-uniformity of luminance. Furthermore, because the first embodiment of the disclosure does not need to separately assign an area for forming the Evss line EVL and an area for connecting the Evss line EVL and the cathode CAT to the thin film transistor array substrate as in the related art, the first embodiment can sufficiently secure an aperture ratio as much as the corresponding areas. In addition, the first embodiment of the disclosure is configured such that the barrier BR for dividing each of the organic compound layer OL, the cathode CAT, and the contact electrode TE in one area and the bank layer BN for bringing the contact electrode TE into direct contact with the Evss line EVL are overlappingly disposed, and thus can minimize a space occupied by the barrier BR and the bank layer BN. Hence, the first embodiment of the disclosure can secure an aperture ratio as much as the corresponding space. Thus, the first embodiment of the disclosure can be easily applied to a high-resolution display having a high pixel per inch (PPI) and can remarkably improve a degree of design freedom.

Second Embodiment

Figure 6:
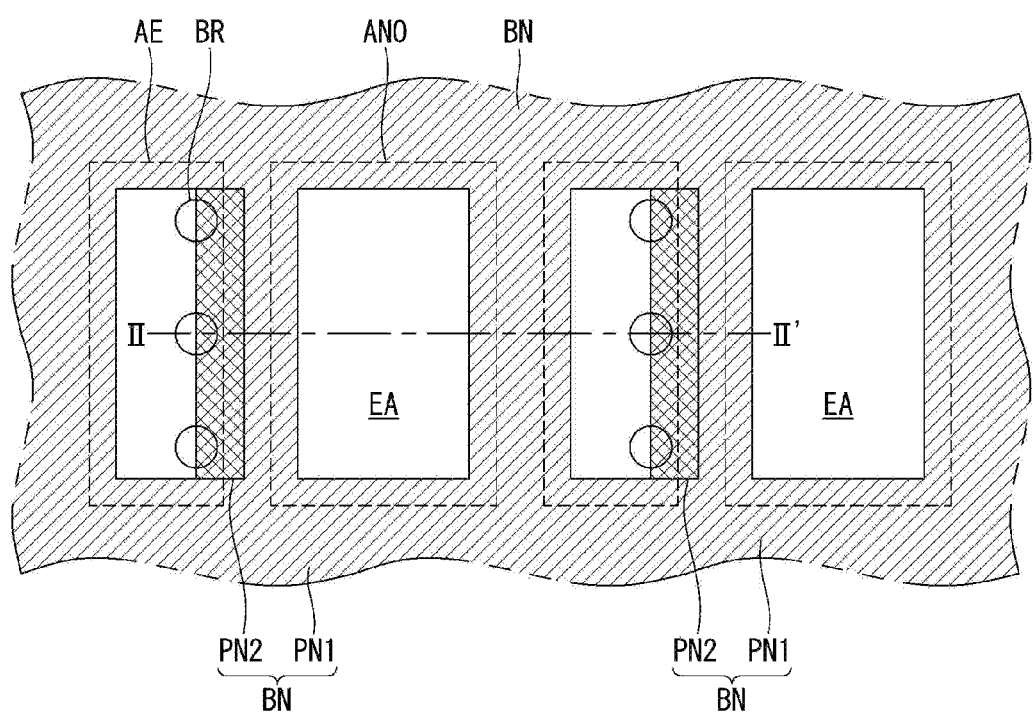
FIG. 6 is a plan view schematically illustrating an OLED display according to a second embodiment of the disclosure.
Figure 7:
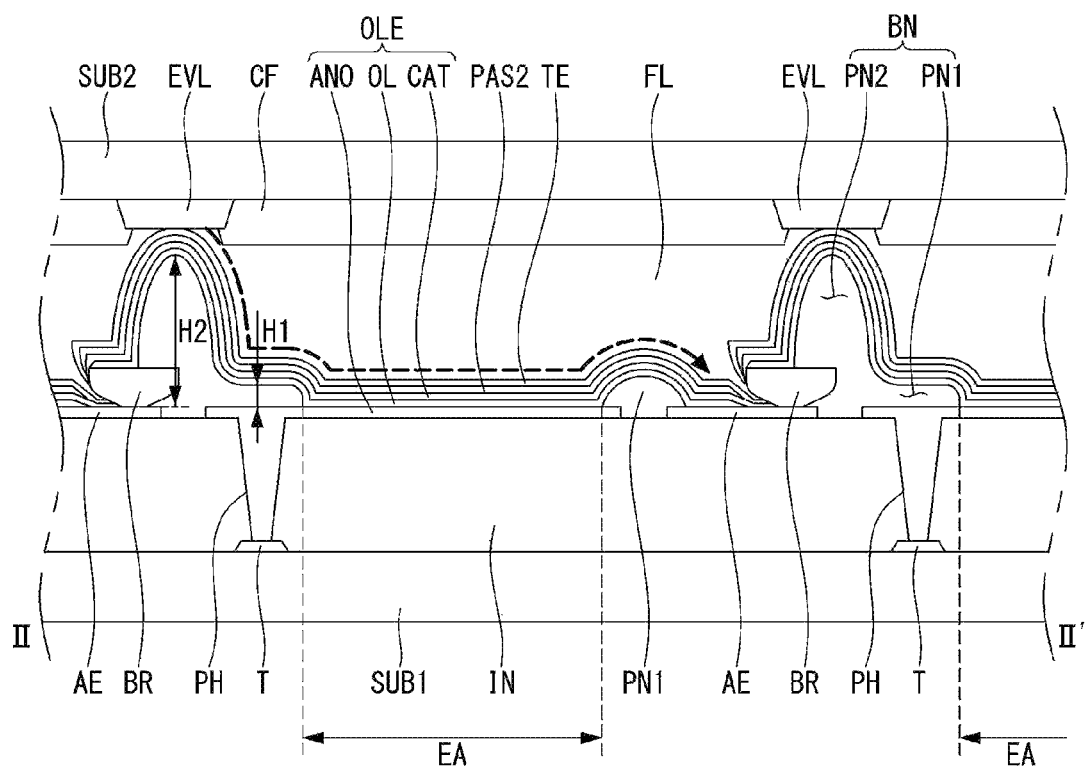
FIG. 7 is a cross-sectional view schematically illustrating an OLED display according to the second embodiment of the disclosure.
Figure 8:
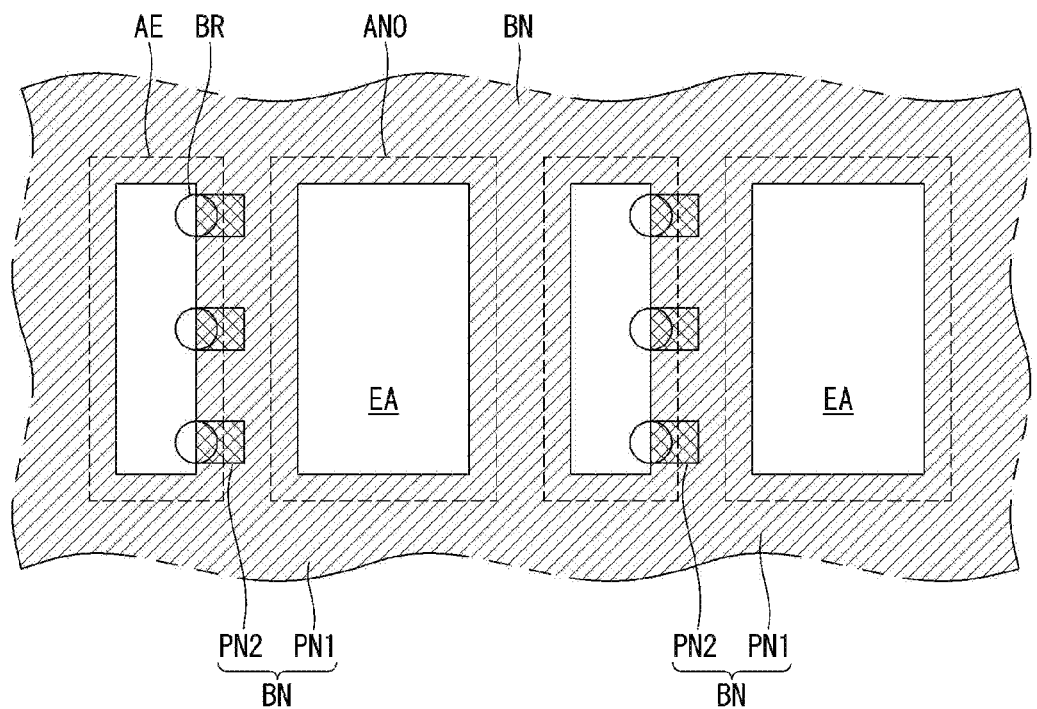
FIG. 8 is a plan view illustrating an example of disposing a second portion of a bank layer according to an embodiment of the disclosure.

FIG. 6 is a plan view schematically illustrating an OLED display according to a second embodiment of the disclosure. FIG. 7 is a cross-sectional view schematically illustrating an OLED display according to the second embodiment of the disclosure. FIG. 8 is a plan view illustrating an example of disposing a second portion of a bank layer according to an embodiment of the disclosure. Description of structures and components identical or equivalent to those illustrated in the first embodiment is omitted in the second embodiment.

The second embodiment of the disclosure may be configured so that a bank layer BN has a different height depending on a position, unlike the first embodiment of the disclosure. More specifically, in the second embodiment of the disclosure, the bank layer BN may be divided into a first portion PN1 and a second portion PN2. The first portion PN1 defines an emission region EA. The second portion PN2 overlaps at least a portion of a barrier BR. The second portion PN2 induces an Evss line EVL on a second substrate SUB2 and a contact electrode TE on a first substrate SUB1 to directly contact each other. A height H1 of the first portion PN1 and a height H2 of the second portion PN2 may be set to be different from each other. In other words, the first portion PN1 of the bank layer BN may be referred to as a portion defining a first opening exposing an anode ANO, and the second portion PN2 of the bank layer BN may be referred to as a portion defining a second opening exposing at least a portion of an auxiliary electrode AE and at least a portion of the barrier BR.

More specifically, because the bank layer BN is formed to have a predetermined taper, an area occupied by a lower end of the bank layer BN increases as a height of the bank layer BN increases. Thus, when the taper control of the bank layer BN is difficult, an aperture ratio may decrease as much as an increase in the height of the bank layer BN. To solve a reduction in the aperture ratio, the second embodiment of the disclosure may be configured such that only the second portion PN2 of the bank layer BN, that overlaps the barrier BR and induces the Evss line EVL and the contact electrode TE to directly contact each other, is maintained at a predetermined height H2. And a remaining portion (i.e., the first portion PN1) of the bank layer BN has a minimum height H1 capable of performing its function. The second embodiment of the disclosure can sufficiently secure the aperture ratio by setting the height H1 of the first portion PN1 of the bank layer BN to be less than the height H2 of the second portion PN2 of the bank layer BN.

A half-tone mask process may be used to form the first and second portions PN1 and PN2 of the bank layer BN having the different heights H1 and H2. Namely, the first portion PN1 and the second portion PN2 of the bank layer BN may be simultaneously formed through one mask process using a half-tone mask.

Referring to FIG. 8, unlike FIG. 6, the second portion PN2 of the bank layer BN may have a dot shape when viewed from the plane. FIG. 8 illustrates that a planar shape of the second portion PN2 is a roughly square shape, by way of example. However, embodiments are not limited thereto. For example, the second portion PN2 may have various planar shapes such as a rectangle, a circle, and an oval.

Because the second portion PN2 of the bank layer BN is configured so that each of an organic compound layer OL, a cathode CAT, a protective layer PAS2, and the contact electrode TE is not completely divided by the barrier BR and maintains its continuity in at least one area, it is sufficient that the second portion PN2 of the bank layer BN is disposed to partially overlap the barrier BR. In this instance, a portion of the barrier BR, that does not overlap the bank layer BN and is exposed, functions to physically divide each of the organic compound layer OL, the cathode CAT, the protective layer PAS2, and the contact electrode TE. One end of the cathode CAT (and the contact electrode TE) that is divided by the barrier BR and is exposed, is connected to the auxiliary electrode AE.

Although the embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display comprising:
a first substrate on which an organic light emitting diode having an anode, an organic compound layer, and a cathode is disposed;
a second substrate on which a power line supplied with a power voltage is disposed, the second substrate facing the first substrate;
an auxiliary electrode;
a barrier on the auxiliary electrode;
a bank layer covering an edge of the auxiliary electrode and a portion of the barrier, wherein the bank layer has a first opening exposing at least a portion of the anode and a second opening simultaneously exposing at least a portion of the auxiliary electrode and at least a portion of the barrier;
a protective layer on the cathode; and
a contact electrode disposed on the protective layer, one end of the contact electrode directly contacting the auxiliary electrode or the cathode; and
wherein the contact electrode and the power line directly contact each other,
wherein the cathode of the organic light emitting diode is on the barrier and the bank layer,
wherein one end of the cathode is configured to directly contact the auxiliary electrode.

2. The organic light emitting diode display of claim 1, wherein the bank layer is divided into a first portion defining the first opening and a second portion defining the second opening,
wherein a height of the first portion is less than a height of the second portion.

3. The organic light emitting diode display of claim 1, wherein the bank layer is divided into a first portion defining the first opening and a second portion overlapping at least a portion of the barrier,
wherein a height of the first portion is less than a height of the second portion.

4. The organic light emitting diode display of claim 1, wherein the protective layer on the cathode exposes at least a portion of one end of the cathode,
   wherein the contact electrode directly contacts the exposed portion of the cathode.

5. The organic light emitting diode display of claim 1, wherein the cathode and the contact electrode are physically spaced from each other with the protective layer interposed therebetween.

6. The organic light emitting diode display of claim 1, wherein the second substrate includes color filters,
   wherein the color filters are partitioned by the power line.

7. The organic light emitting diode display of claim 1, wherein each of the first substrate and the second substrate includes an emission region, to which light from the organic light emitting diode is emitted, and a non-emission region outside the emission region,
   wherein the power line is disposed in the non-emission region.

8. The organic light emitting diode display of claim 1, further comprising a filler layer interposed between the first substrate and the second substrate.

9. The organic light emitting diode display of claim 1, wherein the barrier is divided into a plurality of parts on the auxiliary electrode.

10. The organic light emitting diode display of claim 1, wherein the cathode maintains its continuity in a portion overlapping the bank layer among a formation area of the barrier,
    wherein the protective layer maintains its continuity in a portion overlapping the bank layer among the formation area of the barrier, and
    wherein the contact electrode maintains its continuity in a portion overlapping the bank layer among the formation area of the barrier.

11. The organic light emitting diode display of claim 1, wherein an edge of the barrier has an eaves shape.

12. The organic light emitting diode display of claim 11, wherein the bank layer is formed to have a forward taper shape.

* * * * *